United States Patent
Lin

(10) Patent No.: US 9,165,986 B2
(45) Date of Patent: Oct. 20, 2015

(54) ORGANIC LIGHT EMITTING DIODE PACKAGE AND METHOD FOR MANUFACTURING THE SAME

(71) Applicant: Ye Xin Technology Consulting Co., Ltd., Hsinchu (TW)

(72) Inventor: Pen-Chu Lin, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/144,598

(22) Filed: Dec. 31, 2013

(65) Prior Publication Data

US 2015/0053932 A1 Feb. 26, 2015

(30) Foreign Application Priority Data

Aug. 23, 2013 (TW) .............................. 102130198 A

(51) Int. Cl.
*H01L 27/32* (2006.01)
*H01L 51/56* (2006.01)
*H01L 51/52* (2006.01)

(52) U.S. Cl.
CPC ........ *H01L 27/3244* (2013.01); *H01L 51/5237* (2013.01); *H01L 51/56* (2013.01)

(58) Field of Classification Search
CPC ....................................................... H01J 1/62
USPC .................. 257/40, 99, 787, 794; 438/34
See application file for complete search history.

(56) References Cited

U.S. PATENT DOCUMENTS

| 5,757,126 | A | * | 5/1998 | Harvey et al. ................. 313/506 |
| 7,541,671 | B2 | * | 6/2009 | Foust et al. .................... 257/688 |
| 8,637,883 | B2 | * | 1/2014 | Chakraborty ................... 257/98 |
| 2004/0145310 | A1 | * | 7/2004 | Su et al. ......................... 313/512 |
| 2013/0161592 | A1 | * | 6/2013 | Lee et al. ......................... 257/40 |
| 2014/0117333 | A1 | * | 5/2014 | Lee et al. ......................... 257/40 |

OTHER PUBLICATIONS

Nicola Pinna et al. Atomic layer deposition of nanostructured materials/Chapter 17, publisher Weinheim: 2012.*

* cited by examiner

*Primary Examiner* — Yu-Hsi D Sun
*Assistant Examiner* — Chi-Hua Yang
(74) *Attorney, Agent, or Firm* — Novak Druce Connolly Bove + Quigg LLP

(57) ABSTRACT

An organic light emitting diode (OLED) package includes a substrate, an OLED die mounted on the substrate and an encapsulation layer encapsulating the OLED die. The OLED package further includes a protecting layer formed on the OLED die. The encapsulation layer has a multi-layered structure and is deposited on the protecting layer. Refractive indexes of a cathode of the OLED die, the protecting layer and the encapsulation layer are gradually decreased in the sequence. A barrier layer for blocking moisture from entering the OLED package is formed on a bottom surface of the substrate by atomic layer deposition (ALD) method. The present disclosure also provides a method for manufacturing the OLED package.

16 Claims, 3 Drawing Sheets

ORGANIC LIGHT EMITTING DIODE PACKAGE AND METHOD FOR MANUFACTURING THE SAME

BACKGROUND

1. Technical Field

The present disclosure relates to a semiconductor emitting component and method for manufacturing the semiconductor, and more particularly, to an organic light emitting diode (OLED) and method for manufacturing the same.

2. Description of the Related Art

OLEDs have many advantages, such as light weight, thin thickness, multiple colors and low manufacturing cost, compatibility with integrated circuits, easy driving, long term reliability, and environmental friendliness. Such advantages have promoted the wide use of the OLED in some illuminating device as a plane light source instead of traditional LED.

Due to luminescence properties of the OLED, oxygen or moisture in the air can easily affect the OLED and reduces a lifetime thereof; as such the OLED should be packaged before it is applied to the illuminating device. A conventional OLED package includes an OLED die and an encapsulation layer deposited on the OLED die. However, in the process of packaging the OLED, stress generated by depositing the encapsulation is easily transferred to the OLED die, which causes the OLED to easily crack, thereby reducing the lifespan of the OLED package.

Therefore, it is desirable to provide an OLED package and method for manufacturing the OLED package which can obviate the disadvantages of the prior art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
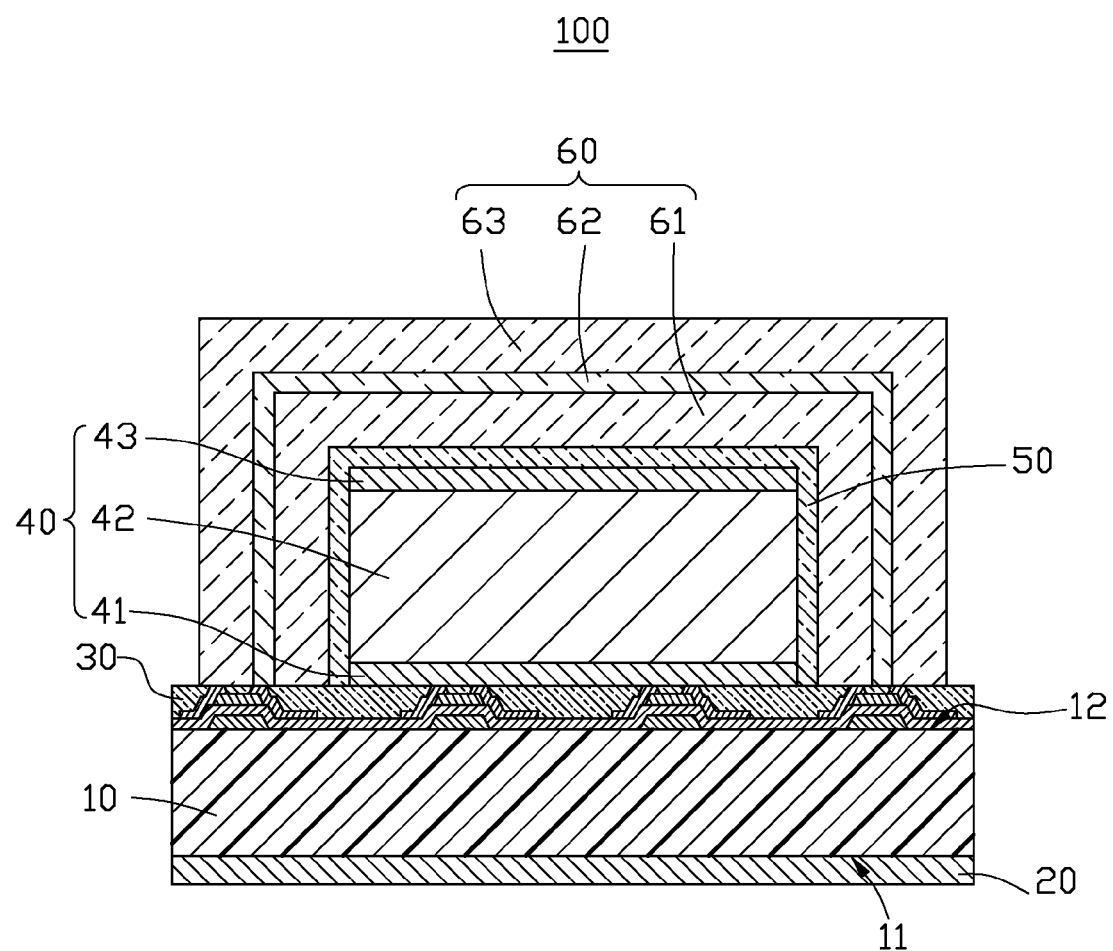
FIG. 1 is a cross-sectional view of an OLED package in accordance with an exemplary embodiment of the present disclosure.
Figure 2:
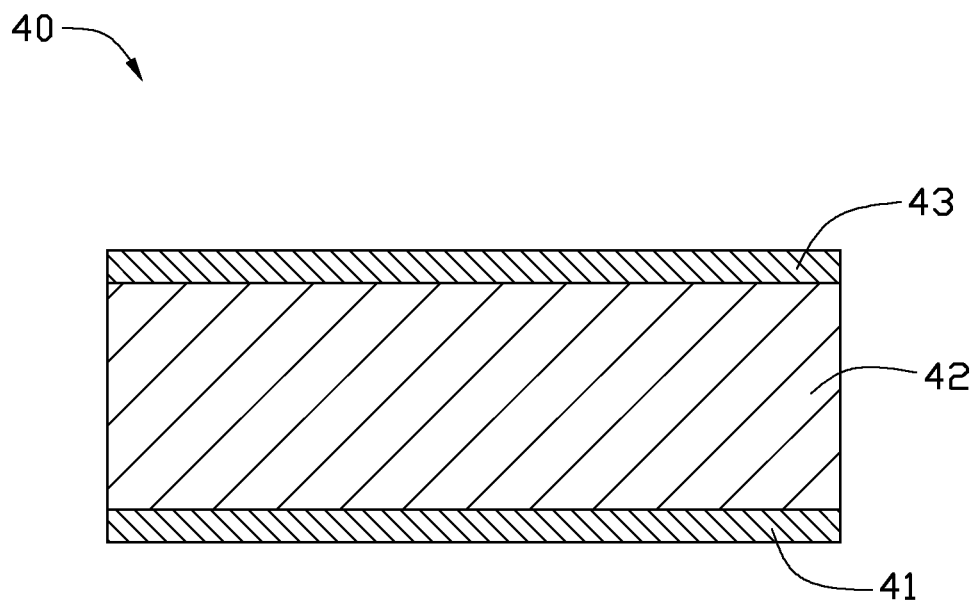
FIG. 2 is a cross-sectional view of an OLED die of the OLED package of FIG. 1.
Figure 3:
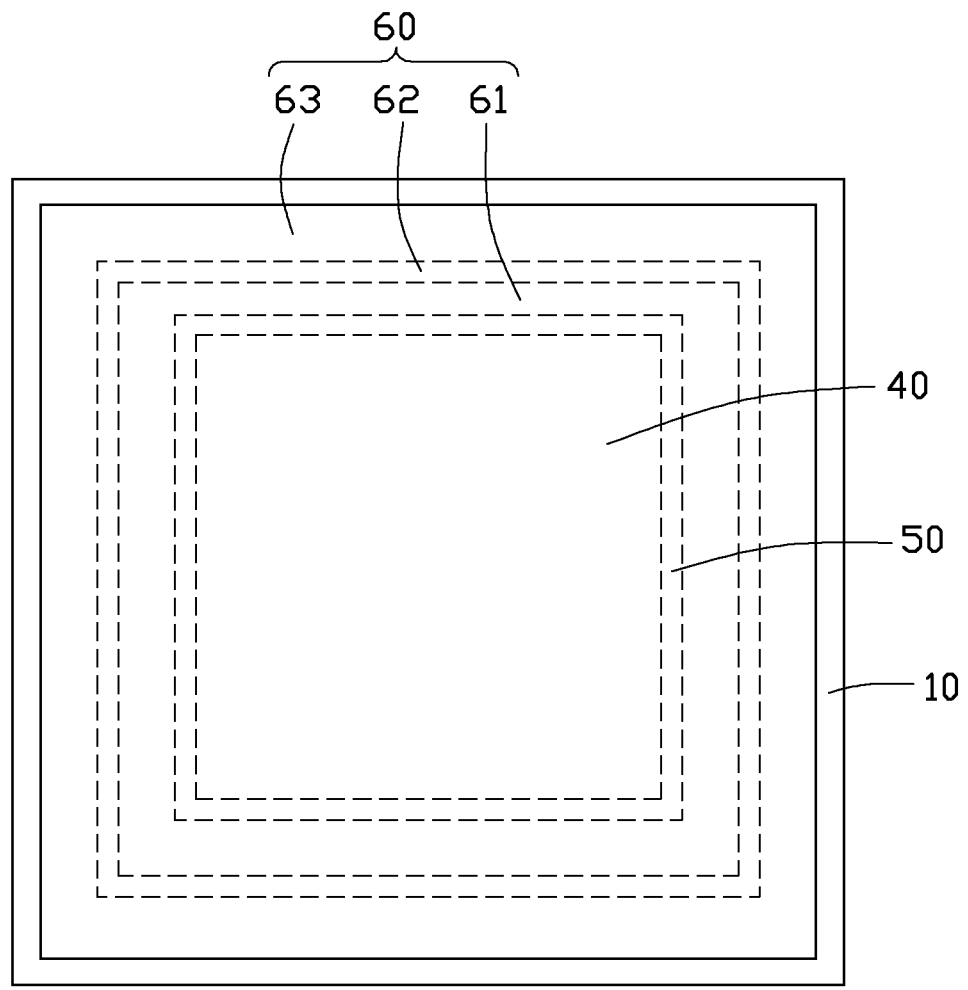
FIG. 3 is a top view of the OLED package of FIG. 1.

Referring to FIGS. 1 to 3, an OLED package 100 in accordance with an embodiment is provided. The OLED package 100 is a top emitting type package. The OLED package 100 includes a substrate 10, a barrier layer 20 and a thin film transistor (TFT) array 30 arranged on the substrate 10, an OLED die 40 arranged on the TFT array 30, a protecting layer 50 arranged on the OLED die 40, and an encapsulation layer 60 arranged on the protecting layer 50.

Specifically, the substrate 10 is flexible and made of some plastic materials such as polyimide, polymer and so on. The substrate 10 includes a bottom surface 11 and a top surface 12 opposite to the bottom surface 11.

The barrier layer 20 is arranged on the bottom surface 11 of the substrate for preventing the moisture in the air from entering the OLED package 100. The barrier layer 20 is a thin film made of some materials such as oxide, nitride, fluoride, metal or organic materials and so on. In this embodiment, the barrier layer 20 is made of aluminum oxide ($Al_2O_3$).

The TFT array 30 is arranged on the top surface 12 of the substrate 10. The TFT array 30 electrically connects with the OLED die 40 for controlling luminous state of the OLED die 40.

Referring to FIG. 2, in this embodiment, the OLED die 40 includes an anode 41 arranged on the TFT array 30, an active layer 42 arranged on the anode 41, and a cathode 43 arranged on the active layer 42. That is, the active layer 42 is sandwiched between the anode 41 and the cathode 43. The anode 41 and the cathode 43 electrically connect with the TFT. The anode 41 is reflective for reflecting part of light generated by the active layer 42 toward the cathode 43. The cathode 43 is semitransparent. A thickness of the cathode 43 is substantially 10 nanometers. The active layer 42 is a transparent semiconductor film.

The protecting layer 50 is arranged on the cathode 43 of the OLED die 40 and covers side surfaces of the OLED 40 for protecting the OLED die 40 from being destructed by stress generated in the depositing process of the encapsulation layer 60. The protecting layer 50 is a translucent film, and the protecting layer 50 is made of some materials such as silicon dioxide ($SiO_2$), silicon nitride (SiN), aluminum oxide ($Al_2O_3$), polymer, etc. Preferably, a refractive index of the protecting layer 50 is smaller than that of the cathode 43.

The encapsulation layer 60 is arranged on the protecting layer 50. The encapsulation layer 60 is a translucent, multi-layered structure. The encapsulation layer 60 includes a light inputting layer 61 arranged on the protecting layer 50, a buffer layer 62 arranged on the light inputting layer 61, and a light outputting layer 63 arranged on the buffer layer 62. The light inputting layer 61 and the light outputting layer 63 are made of same material such as plastic, resin, etc. The buffer layer 62 is sandwiched between the light inputting layer 61 and the light outputting layer 63. The material of the buffer layer 62 is different from that of the light inputting layer 61 and the light outputting layer 63. The buffer layer 62 buffers a flexure stress generated in the encapsulation layer 60 to strengthen a stability of the encapsulation layer 60. The buffer layer 62 is made of some materials such as silicon dioxide ($SiO_2$), silicon nitride (SiN), aluminum oxide ($Al_2O_3$), polymer, etc. Preferably, a refractive index of the encapsulation layer 60 is smaller than that of the protecting layer 50. In this embodiment, the refractive index of the encapsulation layer 60 ranges from 1.46 to 1.9. Alternatively, the encapsulation layer 60 can include a plurality of buffer layers 62 therein. The refractive index of each of the plurality of buffer layers 62 is substantially similar that of the light inputting layer 61 and the light outputting layer 62. The difference between the refractive indexes of the multiple encapsulation layer 60 and the protecting layer 50 increases a light extraction and accordingly a brightness of light radiated by the OLED package 100.

When the OLED package 100 works, since the anode 41 and the cathode 43 of the OLED die 40 electrically connect with the TFT array 30, electrons inside the cathode 43 will be captured by electric holes inside the anode 41 under excitation of an electric field; photons are emitted in the form of light from the active layer 42 where the combinations of the electrons and the electric holes occur. The light generated by the LED die 40 successively passes through the cathode 43 and the protecting layer 50, and enters the encapsulation layer 60 via the light inputting layer 61 and finally radiates out via the light outputting layer 63.

Since a barrier layer 20 is arranged on the bottom surface 11 of the substrate 10, the protecting layer 50 is arranged between the OLED die 40 and the encapsulation layer 60, and a buffer layer 62 is sandwiched between the light inputting layer 61 and the light outputting layer 63, a stability of the OLED package 100 is greatly improved. Correspondingly, the OLED die 40 is protected from being damaged, and a lifetime of the OLED package 100 is prolonged.

In addition, since the refractive index gradually decreases in a direction of from the cathode 43 to the light outputting layer 63, the light output of the OLED package 100 is increased. In other words, a smaller current can be applied to the OLED die to drive the OLED die for generating the required illumination, compared with current needed for driving the LED die in the conventional OLED package. It is appreciated by a person skilled in the art that an OLED die working under a smaller current can have the benefit of a longer lifetime.

The disclosure provides a method for manufacturing the OLED package 100 which includes following steps.

Firstly, the flexible substrate 10 is provided. The barrier layer 20 is plated on the bottom surface 11 of the substrate 10 by atomic layer deposition (ALD) method. The ALD method is a self-limiting method, i.e., the amount of film material deposited in each reaction cycle being constant. Due to the self-limiting characteristics of the ALD method, the barrier layer 20 can be very compact. Furthermore, the barrier layer 20 and the substrate 10 can be tightly connected to each other. Accordingly, the barrier layer 20 can form a good barrier for resisting moisture. Thus, the OLED package 100 is protected from moisture in the air to enter the OLED package 100.

Secondly, the TFT array 30 is arranged on the top surface 12 of the substrate 10.

Thirdly, the OLED die 40 is arranged on the TFT array 30. Specifically, the anode 41 of the OLED die 40 is formed to rest on the TFT array 30, and the anode 41 and the cathode 43 are electrically connected to the TFT array 30.

Thereafter, the protecting layer 50 is plated on the cathode 43 and the protecting layer 50 covers the side surfaces of the OLED die 40. An environmental resistance to moisture and temperature of the protecting layer 50 is better than that of the OLED 40. Accordingly, the protecting layer 50 further protects the OLED 40 from damage from the surrounding environment.

Finally, the encapsulation layer 60 is deposited on the protecting layer 50. Specifically, the light inputting layer 61, the buffer layer 62 and the light outputting layer 63 are successively deposited on the protecting layer 50 by plasma enhanced chemical vapor deposition (PECVD) method, physical vapor deposition (PVD) method or sputter method. Since the encapsulation layer 60 and the OLED die 40 are separated by the protecting layer 50, the high stress generated by depositing the encapsulation layer 60 will not be directly transmitted to the OLED die 40 and the OLED die 40 is protected by the protecting layer 50.

Alternatively, a plurality of protecting layers 50 formed of different materials can be formed between the OLED die 40 and the encapsulation layer 60. The protecting layers 50 are translucent films. In addition, a plurality of buffer layers 62 can be continuously deposited between the light inputting layer 61 and the light outputting layer 63. Preferably, the buffer layers 62 are translucent films.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. An organic light emitting diode (OLED) package, comprising:
   a substrate;
   a barrier layer arranged on a bottom surface of the substrate;
   an OLED die arranged on a top surface of the substrate opposite to the bottom surface;
   a protecting layer arranged on the OLED die; and
   a multi-layered encapsulation layer deposited on the protecting layer;
   wherein the OLED package further comprises a thin film transistor array between the substrate and the OLED die; the thin film transistor array is electrically connected with the OLED die for controlling luminous state of the OLED die; the protecting layer covers at least two opposite side surfaces of the OLED die and is contacted with the thin film transistor array.

2. The OLED package of claim 1, wherein the protecting layer is a translucent film, the protecting layer being made of silicon dioxide ($SiO_2$), silicon nitride (SiN), aluminum oxide ($Al_2O_3$) or polymer.

3. The OLED package of claim 2, wherein the OLED die comprises an anode, a cathode and an active layer sandwiched between the anode and the cathode, the protecting layer being arranged on the cathode.

4. The OLED package of claim 3, wherein the anode is reflective, and the cathode is translucent.

5. The OLED package of claim 1, wherein the substrate is flexible, the barrier layer being made of oxide, nitride, fluoride, metal or organic materials.

6. The OLED package of claim 1, wherein the encapsulation layer is translucent and comprises a light inputting layer and a light outputting layer made of same material, and a buffer layer sandwiched between the light inputting layer and the light outputting layer, the material of the buffer layer being different from that of the light inputting layer and the light outputting layer, the light inputting layer being arranged on the protecting layer.

7. The OLED package of claim 6, wherein a refractive index of the light inputting layer is same as a refractive index of the light outputting layer, the refractive index of the light inputting layer and the light outputting layer ranges from 1.46 to 1.9.

8. The OLED package of claim 7, wherein the reflective index of the light inputting layer and the light outputting layer is less than that of the protecting layer.

9. A method for manufacturing an organic light emitting diode (OLED) package comprising steps:
   providing a substrate;
   forming a barrier layer on a bottom surface of the substrate;
   arranging an OLED die on a top surface of the substrate opposite to the bottom surface;
   arranging a protecting layer on the OLED die; and
   depositing a multi-layered encapsulation layer on the protecting layer;
   wherein the protecting layer covers at least two opposite side surfaces of the OLED die and is connected to the thin film transistor array.

10. The method for manufacturing an OLED package of claim 9, wherein the substrate is flexible, the barrier layer being made of oxide, nitride, fluoride, metal or organic materials and formed by atomic layer deposition (ALD) method.

11. The method for manufacturing an OLED package of claim 9, wherein the protecting layer is plated on the OLED die, the encapsulation layer being deposited on the protecting layer by plasma enhanced chemical vapor deposition (PECVD) method, physical vapor deposition (PVD) method or sputter method, the encapsulation layer being translucent.

12. The method for manufacturing an OLED package of claim 9, wherein the encapsulation layer has a refractive index which is less than a refractive index of the protecting layer.

13. The method for manufacturing an OLED package of claim 12, wherein the refractive index of the encapsulation layer is between 1.46 and 1.9.

14. The method for manufacturing an OLED package of claim 9, wherein a thin film transistor array is formed on the substrate before the step of arranging an OLED die on a surface of the substrate, and the OLED die is formed on the thin film transistor array; the thin film transistor array is electrically connected with the OLED die for controlling luminous state of the OLED die.

15. The method for manufacturing an OLED package of claim 9, wherein the encapsulation layer includes at least a buffer layer which is made of one of following materials: silicon dioxide ($SiO_2$), silicon nitride (SiN), aluminum oxide ($Al_2O_3$), polymer.

16. An organic light emitting diode (OLED) package, comprising:

a substrate;
a barrier layer arranged on a surface of the substrate;
an OLED die on another surface of the substrate opposite to the bottom surface;
a protecting layer arranged on the OLED die, covered side surfaces of the OLED die; and
a multi-layered encapsulation layer deposited on the protecting layer;
wherein the encapsulation layer is translucent and comprises a light inputting layer and a light outputting layer made of same material, and a buffer layer sandwiched between the light inputting layer and the light outputting layer, the material of the buffer layer being different from that of the light inputting layer and the light outputting layer, the light inputting layer being arranged on the protecting layer; the OLED package further comprises a thin film transistor array; the thin film transistor array is arranged between the substrate and the OLED die; the thin film transistor array is electrically connected with the OLED die for controlling luminous state of the OLED die and contacts with the substrate; the protecting layer covers side surfaces of the OLED die and is contacted with the thin film transistor array.

* * * * *